United States Patent [19]

Kumar

[11] Patent Number: 5,164,332
[45] Date of Patent: Nov. 17, 1992

[54] DIFFUSION BARRIER FOR COPPER FEATURES

[75] Inventor: Nalin Kumar, Austin, Tex.

[73] Assignee: Microelectronics and Computer Technology Corporation, Austin, Tex.

[21] Appl. No.: 669,814

[22] Filed: Mar. 15, 1991

[51] Int. Cl.$^5$ .............................................. H01L 21/44
[52] U.S. Cl. ..................................... 437/198; 437/190
[58] Field of Search ................................... 437/190, 198

[56] References Cited

U.S. PATENT DOCUMENTS

| | | | |
|---|---|---|---|
| 4,019,877 | 4/1977 | Gass et al. | 428/626 |
| 4,372,809 | 2/1983 | Grewal et al. | 156/656 |
| 4,650,545 | 3/1987 | Laakso et al. | 156/656 |
| 4,717,439 | 1/1988 | Hajdu et al. | 156/280 |
| 4,810,332 | 3/1989 | Pan | 204/15 |
| 4,952,275 | 8/1990 | Lin et al. | 156/659.1 |
| 4,983,250 | 1/1991 | Pan | 156/628 |

FOREIGN PATENT DOCUMENTS

| | | | |
|---|---|---|---|
| 1-99239 | 4/1989 | Japan | 437/198 |
| 1-204449 | 8/1989 | Japan | 437/198 |
| 1-231351 | 9/1989 | Japan | 437/198 |
| 1-232746 | 9/1989 | Japan | 437/198 |
| 1-239954 | 9/1989 | Japan | 437/198 |

OTHER PUBLICATIONS

O. Bilous et al., "Metal Contacts for Semiconductor Structures," *IBM Technical Disclosure Bulletin*, vol. 8, No. 11, Apr. 1966, p. 1684.

S. Wolf et al., *Silicon Processing for the VLSI Era*, Lattice Press, Sunset Beach, Calif., 1986, pp. 57,58, 367.

Primary Examiner—Brian E. Hearn
Assistant Examiner—Laura M. Holtzman
Attorney, Agent, or Firm—David M. Sigmond

[57] ABSTRACT

A diffusion barrier which reduces the diffusion of a copper feature into an oxygen containing polymer is provided by a copper metal alloy. The diffusion barrier is fabricated by coating a metal on a copper feature, heating the metal and copper feature to form an alloy of the copper feature and the metal, etching the non-alloyed metal which covers the alloy, and depositing an oxygen containing polymer on the alloy. Preferably the metal is aluminum and a copper aluminum alloy diffusion barrier is at least 300 angstroms thick and contains at least 8 percent aluminum on the surface in contact with the polymer.

19 Claims, 2 Drawing Sheets

DIFFUSION BARRIER FOR COPPER FEATURES

BACKGROUND OF THE INVENTION

1. Field of the Invention

The invention relates to a diffusion barrier for reducing the diffusion of copper features, and more particularly to a copper alloy diffusion barrier between copper features and an oxygen containing polymer in an electronic component.

2. Description of Related Art

Integrated circuit chips are normally packaged and interconnected to one another in order to provide a functional electronic computer system. Packaging and interconnection can be accomplished by surface mounting the chips on high performance high density multilayer interconnect (HDMI) substrates (or boards) for multichip modules (MCM). Such substrates not infrequently contain copper features (lines and vias) buried in an oxygen containing polymer dielectric. Normally there are several requirements for the materials used as interlayer dielectrics in HDMI substrates. There include low dielectric constant, low dielectric loss, low thermal coefficient of expansion (TCE), ease of processing, good adhesion to copper and polyimide, and minimal reactivity with other materials. Achieving all of these properties in any one material is difficult. The most popular materials in use at the present time are various polyimides due to their electrical properties and also their low TCE. A major disadvantage of polyimides is their reactivity with copper, which is the most popular metal used for electrical conductors. Copper diffuses into polyimide during high temperature processing of the polyimide. This causes severe corrosion of the copper and the polyimide due to the copper combining with oxygen in the polyimide. The corrosion may result in loss of adhesion, delamination, voids, and ultimately a catastrophic failure of the HDMI substrate.

Other methods have formerly been developed in order to solve the corrosion problem. One approach is to introduce a diffusion barrier between the copper and the polyimide. This diffusion barrier could be metallic, organic, or an inorganic. Metal diffusion barriers have been provided by nickel, titanium, and chromium. For instance, in an additive process disclosed in U.S. Pat. No. 4,810,332 by Pan, the copper pillars are electroplated with 7,000 angstroms of nickel. Thereafter, conventional polyimide deposition and polishing for planarization is applied. The nickel overcoat was demonstrated to provide excellent protection for copper against oxidation/Corrosion during a 390° C. curing step with polyimide over the nickel overcoat. Unfortunately, several drawbacks may arise from selectively electroplating nickel over copper features, including uncoated copper features and "sheeting" nickel on polyimide between spaced copper features. These drawbacks may to occur due to undesired humidity and/or contaminants. Another approach is used in substractive processes where either titanium or chromium is sputtered onto copper, and this thin metal layer is used to stop the copper to polyimide diffusion. Drawbacks with substractive processes may include the need for an additive process, and insufficient resolution from a mask for fine (20 micron) copper features.

Perhaps the ideal solution to the diffusion problem would be the development of a polymer which prevents copper diffusion while fulfilling all the thermal, electrical, and mechanical requirements. Unfortunately, Applicant does not foresee the advent of a new polymer dielectric which will satisfy these requirements in the near future. Therefore, any overcoat method which reduces the complexity of providing a diffusion barrier for copper features adjacent oxygen containing polymers in electronic components may be useful in reducing fabrication costs and enhancing reliability.

SUMMARY OF THE INVENTION

It is known that certain metals such as aluminum make a highly stable interface with oxygen containing polymers such as polyimides. This is due to the formation of an aluminum oxide ($AlO_3$) interface layer which prevents further aluminum diffusion into the polymer. Copper, on the other hand, makes a poor interface with oxygen containing polymers as described above. However, if a certain amount of aluminum is alloyed (i.e. mixed or annealed) with copper then the alloy can inhibit copper diffusion into the polymer. Unfortunately, small amounts of aluminum can significantly increase the electrical resistivity of copper. Therefore, a copper aluminum alloy is not a useful replacement for electrically conductive copper features in HDMI substrates.

An object of the present invention is to provide a method of fabricating a passivation coating on copper features in electronic components so as to reduce the diffusion of copper into an oxygen containing polyimide. The key aspect of the present invention is a metal alloy diffusion barrier which reduces (and for practical purposes eliminates) the diffusion problem. The diffusion barrier is formed by coating the copper features with a metal, heating the component to form a copper metal alloy, etching the non-alloyed metal, and depositing an oxygen containing polymer over the alloy. Suitable metals include aluminum and nickel, whereas suitable oxygen containing polymers include polyimides and polyesters.

A feature of the present invention includes coating a copper feature with a layer of aluminum, applying a rapid thermal anneal to form a copper aluminum alloy at least 300 angstroms thick, wet etching the non-alloyed aluminum wherein the outer surface of the copper aluminum alloy contains at least 8 percent aluminum, and depositing oxygen containing polyimide over the alloy wherein the copper aluminum alloy provides a diffusion barrier between the copper and the polyimide and adhesively secures to the copper and the polyimide.

There are several advantages of the present invention. The copper metal alloy can be a non-conducting overcoat which adheres to both the copper feature and the polymer. All of the processing techniques (e.g. sputtering and rapid thermal anneal) are well developed and work well for very fine copper features (e.g. 20 microns). In addition, the diffusion barrier can be fabricated with relatively few process steps, high yields, and low cost.

These and other objects, features and advantages of the present invention will be more readily apparent from a review of the detailed description and preferred embodiments which follow.

BRIEF DESCRIPTION OF THE DRAWINGS

The following detailed description of the preferred embodiments can best be understood when read in conjunction with the following drawings, wherein.

DETAILED DESCRIPTION OF THE PREFERRED EMBODIMENTS

Figure 1:
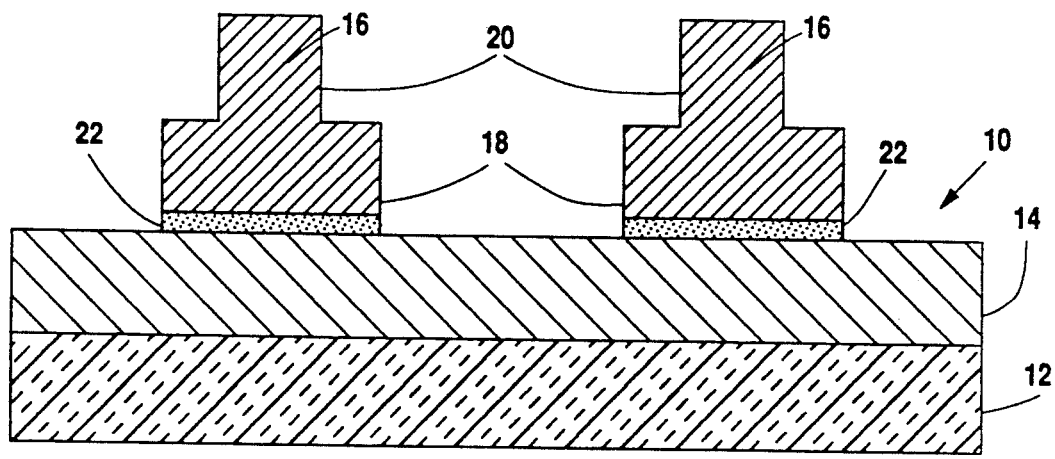
FIGS. 1-5 show fragmentary elevational views in cross-section illustrating successive stages for fabricating an electronic component with a copper metal alloy diffusion barrier formed between copper features and an oxygen containing polymer.

Referring now to the drawings wherein depicted elements are not necessarily shown to scale and wherein like or similar elements are designated by the same reference numeral through the several views and, more particularly to FIG. 1, there is shown a high density multichip interconnect substrate generally designated 10 according to a particularly preferred exemplification of the invention. Substrate 10 includes a silicon base 12 beneath a polyimide dielectric layer 14. Protruding above polyimide 14 are copper features 16. Copper features 16 comprise line sections 18 which are 25 microns wide and 5 microns high, and pillar sections 20 which are 18 microns wide and 10 microns high. An adhesive layer 22 of 500 angstroms chromium is deposited on polyimide 14 and securely attaches copper features 16 to polyimide 14. The structure in FIG. 1 is conventional and can be fabricated, for instance additively, in accordance with U.S. Pat. No. 4,810,332 by Pan which is hereby incorporated by reference. Other approaches for fabricating copper features such as sputtering or evaporating thick copper layers and etching back are well known in the art.

Figure 2:
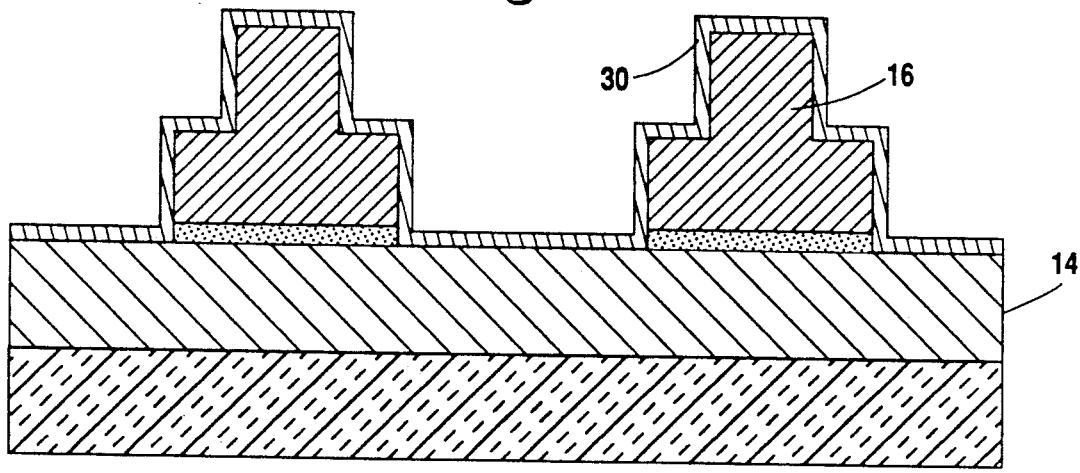

With reference now to FIG. 2, a 1,000 angstrom blanket layer of aluminum 30 is coated over the entire exposed surfaces of copper features 16 and the entire top surface of polyimide 14. Aluminum 30 can be coated by conventional deposition techniques such as sputtering, evaporating and the like. Preferably aluminum 30 is at least 300 angstroms thick to assure that an adequately thick diffusion barrier will be formed.

Figure 3:
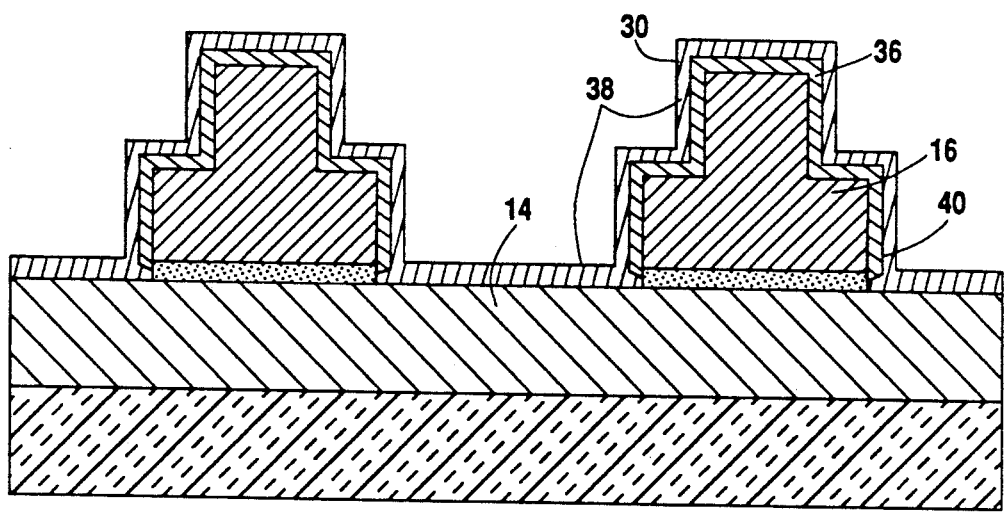

Referring now to FIG. 3, heat is applied to form a thin layer of copper aluminum alloy 36 between copper features 16 and non-alloyed aluminum 38. Preferably, alloy 36 is at least 300 angstroms thick and contains at least 8 percent aluminum (by atomic weight) on the outer surface 40. It is understood that the interface between alloy 36 and copper features 16 and between alloy 36 and non-alloyed aluminum 38 will be a composition gradient which may not be sharply defined. Numerous heating conditions can be used to anneal or alloy the copper with the aluminum. For instance, substrate 10 can be heated between 400° C. and 600° C. for 30 to 180 minutes. However, in order to prevent damaging polyimide 14 in the present illustration, alloy 36 is formed by a rapid thermal anneal, such as by heating substrate 10 to 1100° C. for 1 minute by exposure to a 20 kW lamp. Despite the formation of alloy 36, copper features 16 retain low electrical resistivity, preferably less than 10 micro-ohm-cm, and more preferably approximately the same resistivity of pure copper.

Figure 4:
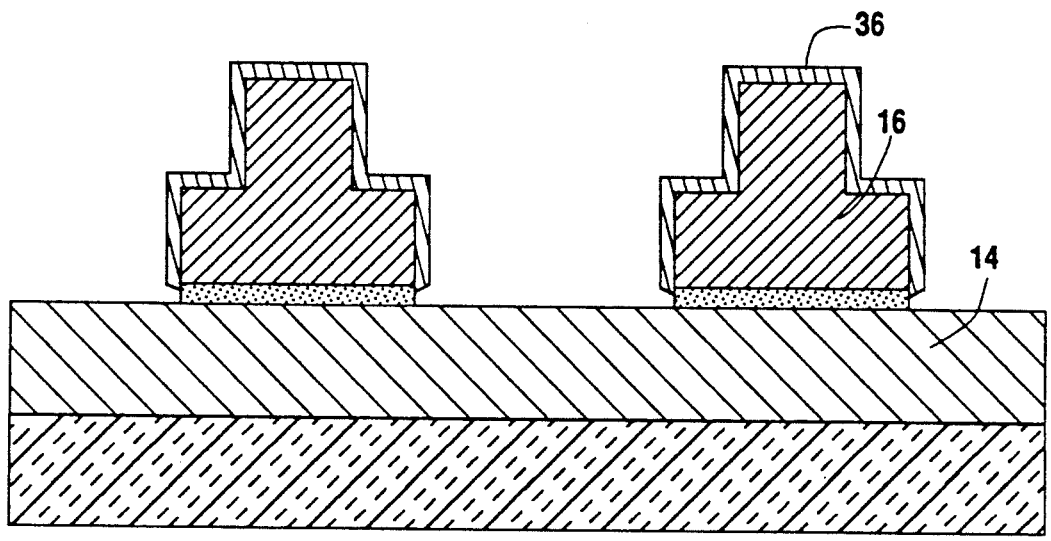

With reference now to FIG. 4, the non-alloyed aluminum 38 is etched and removed. While a dry etch can be used, preferably a wet etchant is applied which selectively removes all of aluminum 38 without removing alloy 36, copper features 16 or polyimide 14.

Figure 5:
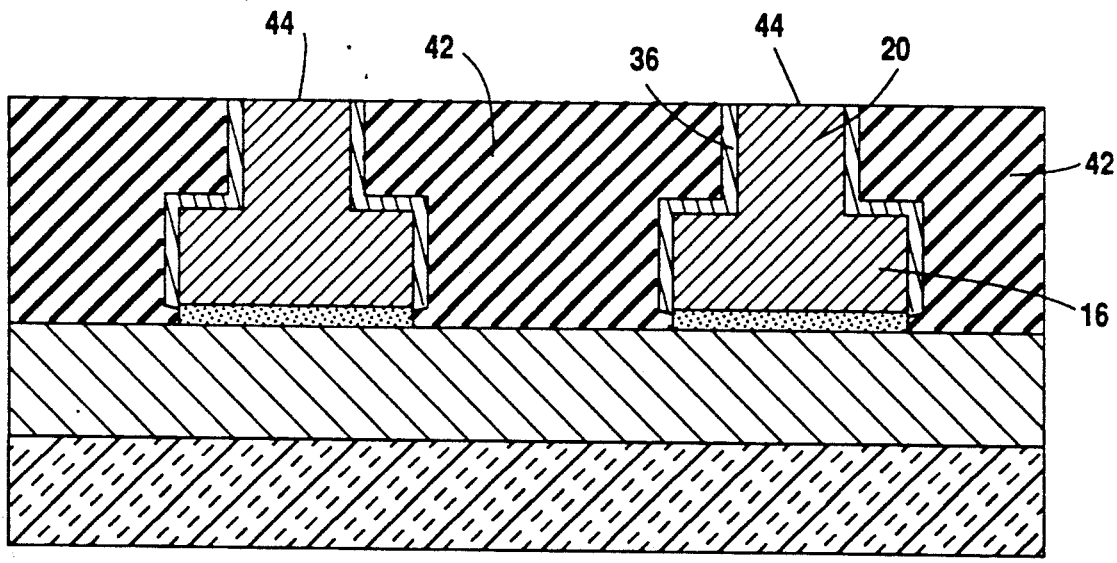

Referring now to FIG. 5, an oxygen containing polyimide 42 is deposited over substrate 10 and is planarized by polishing as is conventional. Preferably the copper aluminum alloy 36 on top surface 44 of copper pillars 20 is also polished and removed to expose copper features 16 and allow good electrical interconnections thereto in subsequent manufacturing stages. Alloy 36 not only provides a protective diffusion barrier which reduces the diffusion of copper 16 into polyimide 42, but also adhesively secures to both copper 16 and polyimide 42.

Finally, it is important to note that the present invention has been experimentally demonstrated for a copper aluminum alloy. The adhesion of polyimide to copper containing small amounts of aluminum was tested by preparing thin films of copper aluminum alloy by E-beam co-evaporation. Several samples with different concentrations of aluminum in copper were prepared and tested for adhesion and diffusion. It was found that if the copper film contained more than 8 percent aluminum, then the adhesion to polyimide was quite good and the copper aluminum alloy acted as a good diffusion barrier for the copper.

The present invention, therefore, is well adapted to carry out the objects and attain the ends and advantages mentioned, as well as others inherent therein. While presently preferred embodiments of the present invention have been described for the purpose of disclosure, numerous other changes and modifications in the details of construction, arrangement of parts and steps of processing can be carried out without departing from the spirit of the invention which is intended to be limited only by the scope of the appended claims.

What is claimed is:

1. A method for making a diffusion barrier for a copper feature, comprising the following steps in the sequence set forth:
   coating a metal on a copper feature;
   heating the metal and copper feature to form an alloy of the copper feature and the metal on the copper feature;
   etching the non-alloyed metal; and
   depositing an oxygen containing polymer over the alloy, wherein the alloy provides a diffusion barrier which reduces diffusion of the copper feature into the polymer.

2. The method of claim 1 wherein the metal is selected from the group consisting of aluminum and nickel.

3. The method of claim 1 wherein the metal is aluminum and the alloy is copper aluminum alloy.

4. The method of claim 3 wherein the copper aluminum alloy is at least 300 angstroms thick.

5. The method of claim 3 wherein the outer surface of the copper aluminum alloy contains at least 8 percent aluminum.

6. The method of claim 3 wherein the copper feature protrudes above a base and the coating forms an aluminum layer which covers the copper feature and the base.

7. The method of claim 3 wherein after the copper aluminum alloy is formed the electrical resistivity of the copper feature is at most 10 micro-ohm-cm.

8. The method of claim 3 wherein the etching is by a wet chemical etchant which removes all of the non-alloyed aluminum without removing the copper aluminum alloy or the copper feature.

9. The method of claim 3 wherein the heating is performed by a rapid thermal anneal.

10. A method for making a diffusion barrier for a copper feature, comprising the following steps in the sequence set forth:
    coating a layer of aluminum at least 300 angstroms thick on a copper feature;
    heating the aluminum and copper feature to form a copper aluminum alloy at least 300 angstroms thick which covers the copper feature, adheres to the copper feature, and is covered by non-alloyed aluminum;

etching the non-alloyed aluminum to expose an outer surface of copper aluminum alloy which contains at least 8 percent aluminum; and depositing an oxygen containing polymer on the outer surface of the copper aluminum alloy, wherein the copper aluminum alloy adheres to the polymer and provides a diffusion barrier which reduces diffusion of the copper feature into the polymer.

11. The method of claim 10 wherein the heating is between 400° C. to 600° C. for 30 to 180 minutes.

12. The method of claim 10 wherein the heating is performed by a rapid thermal anneal.

13. The method of claim 12 wherein the rapid thermal anneal is approximately 1100° C. for 1 minute.

14. The method of claim 10 wherein the etching is by a wet chemical etchant.

15. The method of claim 10 wherein the polymer is polyimide.

16. The method of claim 10 wherein a plurality of spaced copper features protrude above the top surface of a base, prior to etching the layer of aluminum entirely covers the outer surface of the copper features and the top surface of the base, and after etching the non-alloyed aluminum on the top surface of the base between the copper aluminum alloy covered copper features is removed.

17. The method of claim 16 wherein the base is part of an electronic component.

18. The method of claim 17 wherein the electronic component is an electrical interconnect substrate.

19. The method of claim 18 wherein the base is polyimide and the polymer is polyimide.

* * * * *